(12) United States Patent
Zhang et al.

(10) Patent No.: US 11,599,691 B2
(45) Date of Patent: Mar. 7, 2023

(54) ILLUMINATION PLANNING SYSTEM

(71) Applicant: LEDVANCE LLC, Wilmington, MA (US)

(72) Inventors: Yafen Zhang, Shenzhen (CN); Heng Li, Shenzhen (CN); Shu Yi, Shenzhen (CN); Zhijun Ou, Shenzhen (CN); Wuqiang Liao, Shenzhen (CN); Jianfei Zheng, Shenzhen (CN)

(73) Assignee: LEDVANCE LLC, Wilmington, MA (US)

( * ) Notice: Subject to any disclaimer, the term of this patent is extended or adjusted under 35 U.S.C. 154(b) by 245 days.

(21) Appl. No.: 16/937,721

(22) Filed: Jul. 24, 2020

(65) Prior Publication Data
US 2022/0027532 A1   Jan. 27, 2022

(51) Int. Cl.
*G06F 30/20* (2020.01)
*G06F 30/13* (2020.01)

(52) U.S. Cl.
CPC .............. *G06F 30/20* (2020.01); *G06F 30/13* (2020.01)

(58) Field of Classification Search
CPC ................................ G06F 30/13; G06F 30/20

USPC ............................................................ 703/1
See application file for complete search history.

(56) References Cited

U.S. PATENT DOCUMENTS

| | | | |
|---|---|---|---|
| 2018/0242430 A1* | 8/2018 | Gopal Samy | H05B 47/175 |
| 2019/0188338 A1* | 6/2019 | Srivastava | G06N 5/00 |
| 2019/0340306 A1* | 11/2019 | Harrison | G06T 15/506 |

* cited by examiner

*Primary Examiner* — Andre Pierre Louis
(74) *Attorney, Agent, or Firm* — Tutunjian & Bitetto PC

(57) ABSTRACT

A computer implemented method for illumination planning is provided that includes providing a floorplan having at least one lighting space; and assigning functions to the at least one lighting space. The lighting space and functions assigned to the lighting space of the floorplan are matched to a historical lighting schema. A lighting layout is extracted from the historical lighting schema and matched to the lighting space. A light package is extracted from the historical lighting schema and matched to the lighting space. A calculation of lighting performance for the lighting layout and the light package that has been matched to the lighting space is conducted to determine whether the lighting performance meets a lighting standard or whether the lighting performance does not meet the lighting standard. The computer implemented method further includes producing a conclusion for the lighting scenario for suitability to the floorplan and functions.

20 Claims, 9 Drawing Sheets

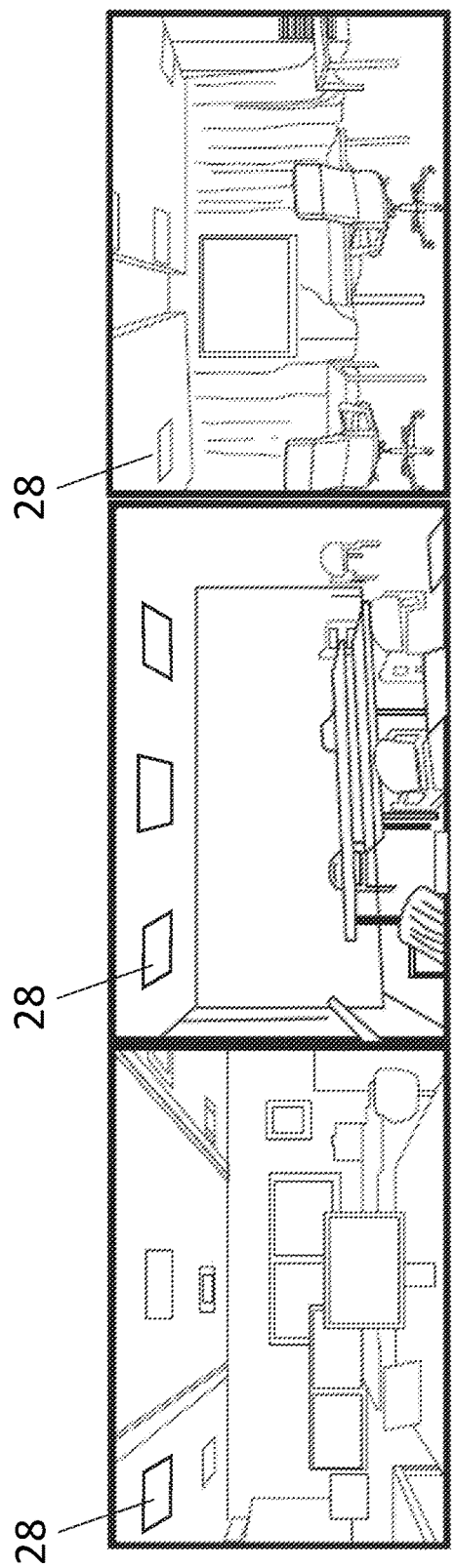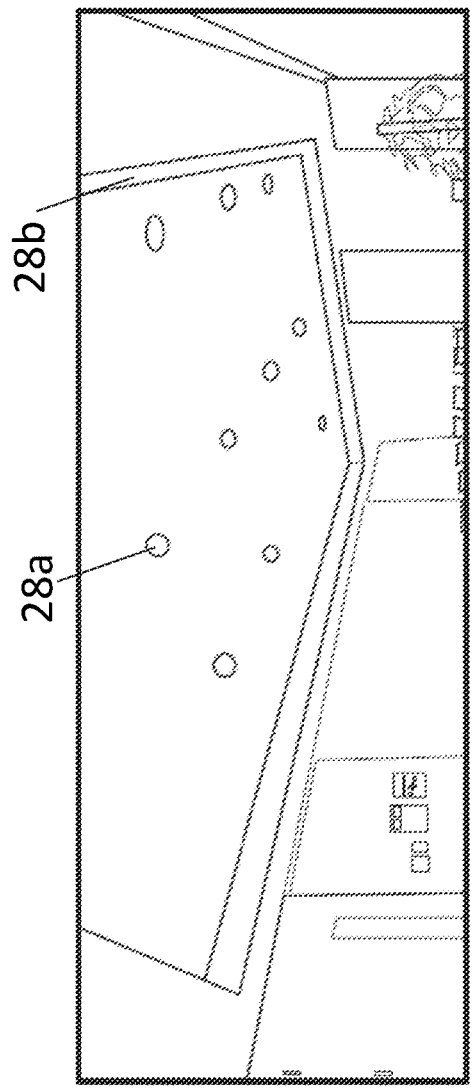
FIG. 3
FIG. 4

ILLUMINATION PLANNING SYSTEM

BACKGROUND

The present invention generally relates to lighting, and more particularly to simulation of lighting conditions.

Artificial lighting systems for closed environments ("indoors") are available that aim at improving the visual comfort experienced by users. For example, lighting systems are known that simulate natural lighting, namely the type of lighting available in open-air environments. This is only one example of a type of lighting that may be desired for interior artificial lighting. There are tens of thousands of luminaire types available on the market. For a normal user, it is difficult amongst the amount, e.g., tens of thousands of possible luminaires, to select the particular products needed to achieve the type of lighting they desire. For professionals, it can be at least time consuming to determine what lighting specifications are applicable for specific lighting environments.

SUMMARY

In accordance with one aspect of the present invention, a computer implemented method for illumination planning is provided. In one embodiment, the method for illumination planning includes providing a floorplan having at least one lighting space; and assigning functions to the at least one lighting space. The lighting space and functions assigned to the lighting space of the floorplan are matched to a historical lighting schema. A lighting layout is extracted from the historical lighting schema and matched to the at least one lighting space. A light package is extracted from the historical lighting schema and matched to the at least one lighting space. A calculation of lighting performance for the lighting layout and the light package that has been matched to the at least one lighting space is conducted to determine whether the lighting performance meets a lighting standard or whether the lighting performance does not meet the lighting standard. The computer implemented method further includes producing a conclusion for the lighting scenario for suitability to the floorplan and functions. The conclusion for the lighting scenario can include a report for installation of the lighting layout and the light package when the lighting performance meets the lighting standard. The conclusion for the lighting scenario can include a recalculation of lighting performance of at least one of a modified lighting layout and a modified light package to meet the lighting standard.

In another aspect, a system for planning illumination is provided. In one embodiment, the system includes an interface for receiving at least one of a floorplan having at least one lighting space, and assigned functions for the at least one lighting space. The system includes at least one form of memory for a database historical lighting schemas and a database of lighting fixtures. The system can include a definition of social activities and functions. Schemas and lighting fixture are matched to social or working functions by the system. The system for planning illumination further includes a lighting device layout extractor for extracting a lighting layout from the historical lighting schema matched to the lighting space; and a lighting space modeling tool for extracting a light package is extracted from the historical lighting schema providing a lighting simulation for the lighting layout and the lighting package. A lighting performance calculator can calculate lighting performance for the lighting layout and the light package to determine whether the lighting performance meets a lighting standard or whether the lighting performance does not meet the lighting standard. If the lighting performance does not meet the lighting standard, a lighting adjustment calculator can provide for a recalculation of lighting performance of at least one of a modified lighting layout and a modified light package to meet the lighting standard. If the lighting performance does meet the lighting standard, a report generator can generate a report for installation of the lighting layout and the light package. The instructions may also include instructions for the installation and selection of control devices for controlling the lighting fixtures of the light package.

In yet another aspect, the present disclosure provides a computer program product for illumination planning. The computer program product may include a computer readable storage medium having program instructions embodied therewith, the program instructions executable by a processor. The method actuated by the computer program product may include receiving a floorplan having at least one lighting space; and assigning, using the processor, functions to the lighting space. The method can further match, using the processor, the lighting space and functions assigned to the lighting space to a historical lighting schema; and extract a lighting layout, using the processor, from the historical lighting schema that is matched to the lighting space. The method may also extract a light package, using the processor, from the historical lighting schema that is matched to the lighting space. In a following step, the method calculates lighting performance, using the processor, for the lighting layout and the light package that has been matched to the lighting space to determine whether the lighting performance meets a lighting standard or whether the lighting performance does not meet the lighting standard. The method can continue to generate a conclusion, using the processor, for the lighting scenario for suitability to the floorplan and functions. The conclusion can include a report for installation of the lighting layout and the light package when the lighting performance meets the lighting standard. In the event that the lighting layout and lighting package does not meet the lighting standard, the conclusion may also include a recalculation of lighting performance of at least one of a modified lighting layout and a modified light package to meet the lighting standard.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 3 is an illustration of a lighting layout for a uniform light fixture distribution in an office space, in accordance with one embodiment of the present disclosure.

FIG. 4 is an illustration of a lighting layout including for a space including a uniformly arranged downlight width with linear lights arranged along the perimeter.

DETAILED DESCRIPTION

Figure 1:
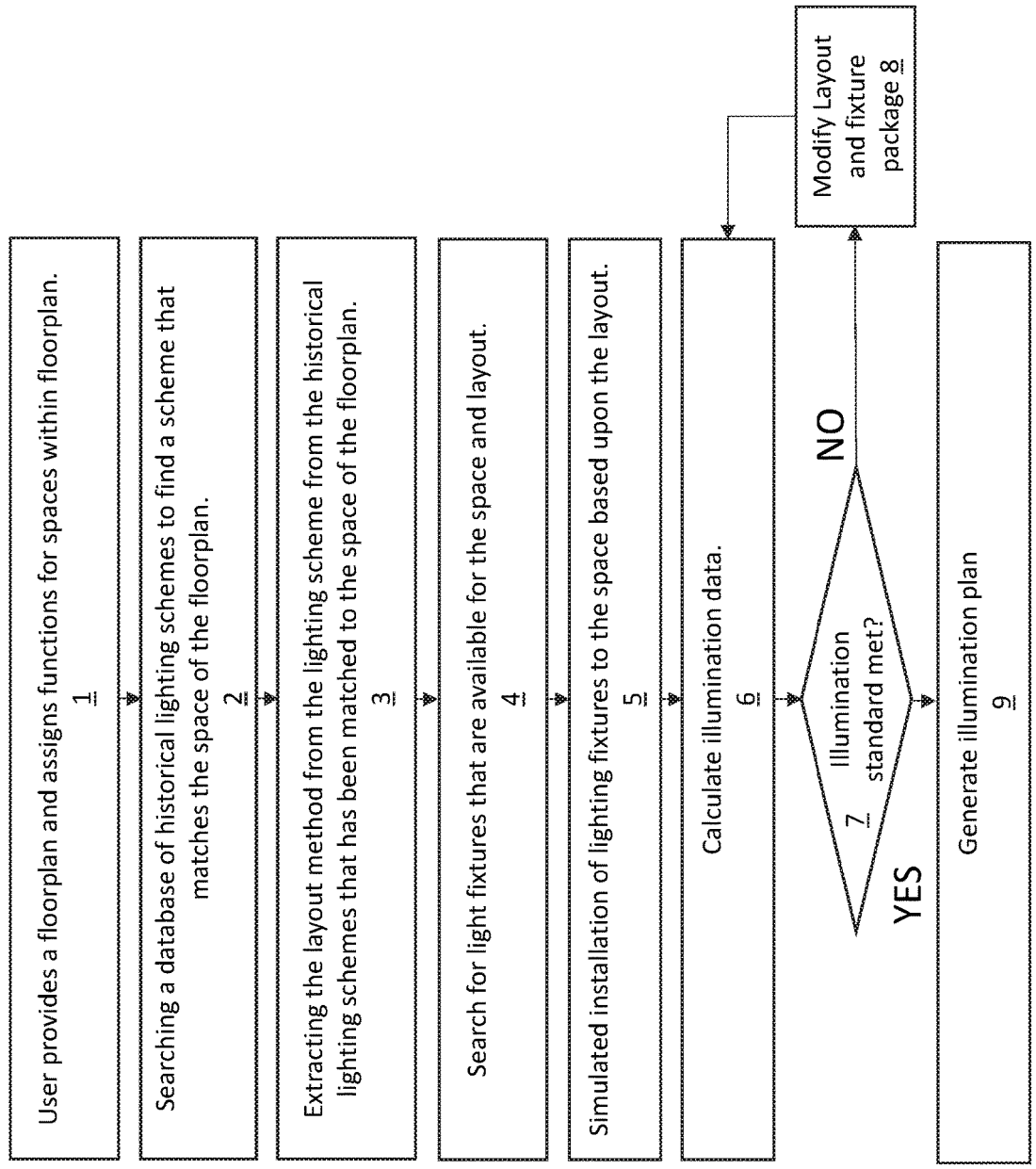
FIG. 1 is a flow diagram showing a method for employing an illumination planning system, in accordance with one embodiment of the present disclosure.

The methods, systems and computer program products of the present disclosure provide a lighting layout and lighting scene that is prepared to illuminate a custom floorplan. There are thousands of luminaire types available on market. For a normal user, i.e., general consumer, it can be hard for them to locate the product, e.g., luminaire type, suitable to meet their lighting needs. The more complicated a lighting environment, the more likely that a normal user of lighting products will need the assistance of a lighting professional. For professionals, it is time consuming to determine the lighting specifications, e.g., light accessory, distribution etc. For places like offices, more professional lighting solutions may be needed. First, the corresponding illumination standard should be satisfied as basic level. However, for more commercial applications, such as office settings, the mounting methods for the lights should be considered to make sure the solution for all the fixtures selected can be installed correctly. It can be important to consider whether the style and lighting effects of a solution package is appropriate for the social features of the space.

Professional lighting designers are usually responsible for designing lighting solutions. For example, a professional lighting designer can evaluate the situation of the space, pick the lighting fixtures for the space, arrange the lighting fixtures in the right location, perform an illumination evaluation, and provide a lighting plan and related documents to illuminate the space. The lighting plan and related documents can include specifications, construction drawings, evaluation reports, etc.

However, for consumers that are seeking general lighting solutions, the consumer may need a way to help them get a general lighting solution via an easier approach, such as one that does not require the input of a professional lighting designer. Not using the services of a professional lighting designer can result in a significant cost savings to the general consumer.

In some embodiments, the methods, systems and computer program products can provide an illumination planning system through which an ordinary user (consumer) can generate the right lighting solution without employing lighting professionals. In some embodiments, the methods, systems and computer program products can provide an illumination planning system that can provide lighting solutions that are suitable for the basic function of the space, e.g., the basic function for a work space, the basic function for a resting space, the basic function of a food preparator and/or consumption space. In some embodiments, the methods, systems and computer program products can provide an automatically generated lighting plan that can meet both the illumination standards and social function needs of the space. In some embodiments, the methods, systems and computer program products can also calculate and place control devices, e.g., SMART control devices, when SMART controls are needed to control the lighting fixtures. A smart device is an electronic device, generally connected to other devices or networks via different wireless protocols such as Bluetooth, Zigbee, NFC, Wi-Fi, LiFi, 3G, etc., that can operate to some extent interactively and autonomously. Several notable types of smart devices are smartphones, smart cars, smart thermostats, smart doorbells, smart locks, smart refrigerators, phablets and tablets, smartwatches, smart bands, smart key chains, smart speakers and others. The term can also refer to a device that exhibits some properties of ubiquitous computing, including although not necessarily-artificial intelligence. In some embodiments, the methods, systems and computer program products can generate the connection among fixtures and control devices for easier deployment. The methods, systems and computer program products are now described with greater detail with reference to FIGS. 1-10.

Figure 2:
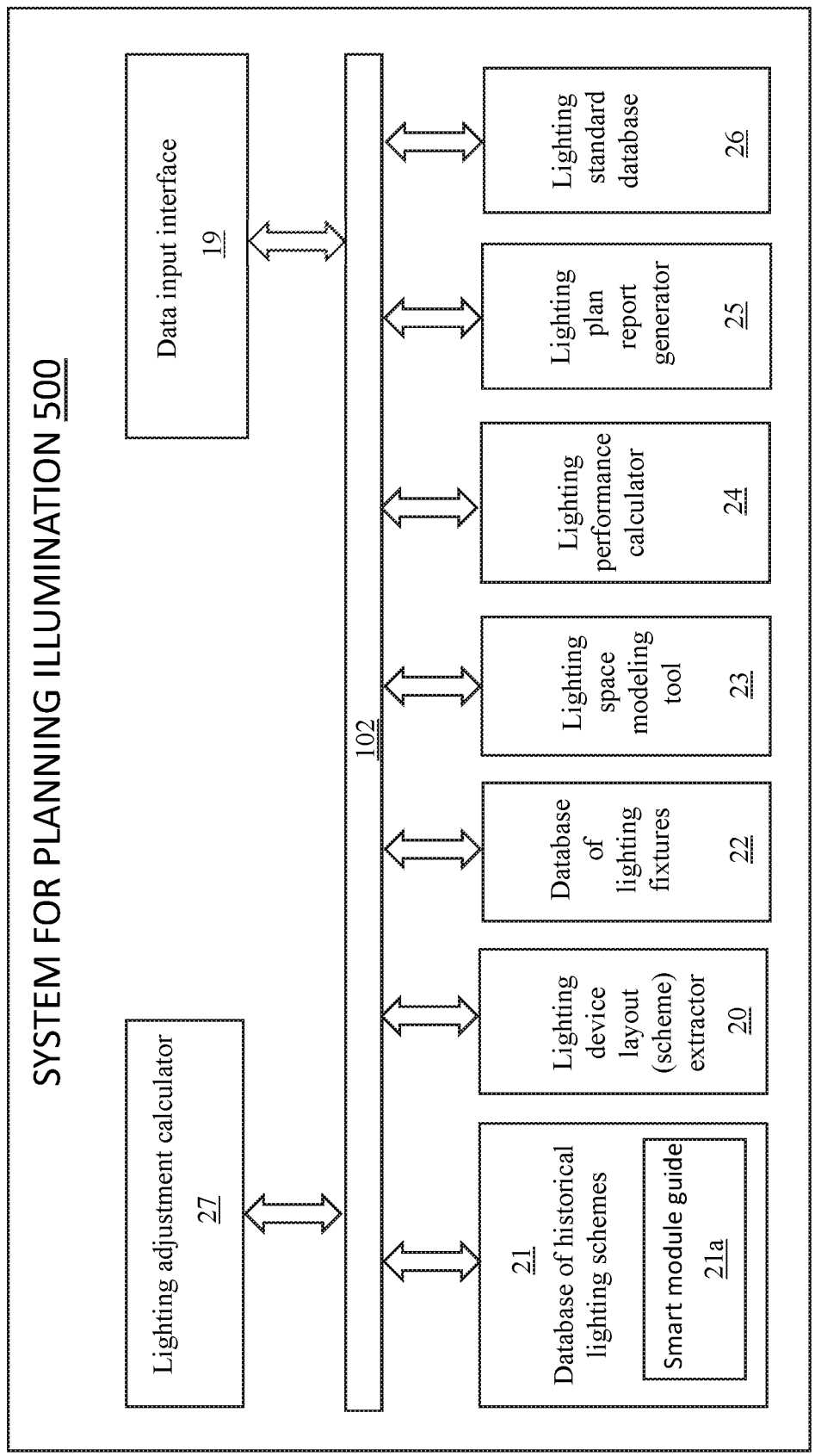
FIG. 2 is a flow/block diagram depicting a first embodiment of a system for providing an illumination plan, in accordance with one embodiment of the present disclosure.

FIG. 1 is a flow/blow diagram showing a method for illumination planning. FIG. 2 is a flow/block diagram depicting an embodiment of a system for providing an illumination plan. The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring to FIG. 1, in some embodiments, the method may include the user (also referred to as consumer/lighting client) providing a floor plan of the lighting space at block 1 to a system for automatic illumination planning 500. Referring to FIG. 2, the system for automatic illumination planning 500 (also referred to as automatic illumination planning system 500) may include at least a database of historical lighting schemas 21, a lighting device layout (schema) extractor 20, a database of lighting fixtures 22, a lighting space modeling tool 23, a lighting performance calculator 24 and a lighting plan report generator 25.

The database of historical lighting schema 21 is built to store predefined schema for use with the systems, methods and computer program products of the present disclosure. A schema that is stored in the database of historical lighting schema may include at least one component selected from conditions of example lighting spaces or lighting fixture models, lighting layout packages, and smart module guides. In some examples, the conditions of lighting space for a schema can include triangulated are for the space, designations of functions of the spaces, e.g., meeting room only, ceiling type and combinations thereof. In some examples, the fixture package can include information on fixture type, e.g., panel, downlight, floor lamp or combinations thereof. In some examples, the lighting layout package can consist of a number of layout guides, which can include information, such as how far the light fixtures should be positioned from the wall, how the light fixtures should be positioned from whiteboards, etc. The database of historical lighting schema 21 can include a smart device guide 21a. The smart device guide 21a may include information, e.g., device specifications and installation instructions, for controlling the lighting fixtures and their installation. The schema that is stored in the database of historical lighting schema 21 may be manually added by lighting professionals, or the lighting schema may be learned by the system for automatic illumination planning 500. For example, a successful light schema that is matched to the layout provided by the user can be added to the database of historical lightings schema 21. The database of historical lighting schema 21 is produces as a step of building a system for planning illumination 500. The user enters the floorplan into the system 500 that employs the database of historical lighting schema 21, in which the system uses the information in the database of schema 21 to provide a customized lighting layout and lighting package for the user's floor plan. The database is referred to as being "historic", because it is created prior to the user providing the floorplan at block 1 of the method illustrated in FIG. 1.

The floorplan of the lighting space that is provided by the user at block 1 may be an architectural type drawing, or building plan. This document includes a description of the size of the space, and the geometry of the space, etc. The description of the size of the space may include a description of the size and position of interior and/or exterior walls that define the perimeter of the overall space, as well as the perimeter of walls for interior spaces. The document may include the location of openings to a room, such as doorways and windows. The document for the floorplan may include the size of the doorways and windows.

In some embodiments, the step at block 1 for providing the floor plan may also include assigning a function for the spaces, e.g., rooms, within the floor plan. Assigning functions may include assigning the spaces, e.g., rooms, within the floor plan with a room type, e.g., an office, a hallway, a walkway, a closet, a bathroom, a washroom, a food preparator location, a food consumption location, a living space, a formal dining room, a showroom, a display room, a bedroom, a garage, a sunroom, a room for an entryway, a balcony, a guestroom, a storage location, a work out room, a gymnasium and combinations thereof. The function assigned to the room may include specialty functions, such as specialty rooms for the growth of particular species of plants. The function may also include the care of particular animals, which may require special lighting needs.

The information that is provided to the system 500 by the user through the layout and the functions for the layout assigned at block 1 may include ceiling type, geography features, social features, area features, user preferences for color correlated temperature (CCT) and other preferred light characteristics.

Referring to FIGS. 1 and 2, an interface 19 of the system 500 may receive the floorplan and function assignments from the user at block 1 of the method. The step of searching the database of historic lighting schema 21 may include doing a fuzzy search of the database of historical lighting schema to find schemas that generally meet the features of the space provided by the layout and functions for the floorplan provided by the user at block 1.

A fuzzy search is a process that locates content, e.g., schema, that is likely to be relevant to a search criteria even when the search criteria does not exactly correspond to the desired information. In computer science, approximate string matching (often colloquially referred to as fuzzy string searching) is the technique of finding strings that match a pattern approximately (rather than exactly). The problem of approximate string matching is typically divided into two sub-problems: finding approximate substring matches inside a given string and finding dictionary strings that match the pattern approximately.

The user may employ any computing device to enter the floorplan and function assignments. For example, the user can employ a mobile computing device having a user interface for entering data through which the user can communicate with the system 500. The mobile computing device may be a laptop, table, smartphone or dedicated device. The interface 19 of the system 500 may be a hard wired connection to the mobile device, or the interface 19 of the system 500 can provide for wireless connectivity to the system 500. In some examples, the system 500 can be entirely integrated into the mobile device that is being employed by the user to enter data, e.g., to enter the floorplan and/or function assignments for the different sections of the floorplan.

Referring to FIG. 1, the method can continue with block 2. Block 2 includes searching the database of historical lighting schemas 21 to find suitable schemas for the space from the different sections of the floorplan that was entered in block 1. The database of historical lighting schemas 21 is stored in memory (e.g., a hardware memory device) in the system 500.

A lighting schema may include a lighting plan package that is suitable for the floorplan space for the assigned function. A lighting plan package may include fixture types, a fixture schedule for fixture specifications, a fixture layout plan, and a fixture installation guide. Example of fixture types can include hanging pendants, desk lamps, table lamps, floor lamps, chandelier lamps, recessed can downlights, track lighting, and 2×2 and/or 2×4 tube lighting office type fixtures. Light emitting diode (LED) lighting elements can be employed in each of the aforementioned fixtures. The fixture schedule and fixture specifications may include both the physical geometries, dimensions, and appearance options, e.g., color, for the fixtures; and the lighting performance characteristics of the fixtures. The lighting characteristics performance may include lumens, color, color correlated temperature (CCT) and service life. The lighting characteristic performance may also be characterized by their type of lighting, e.g., general (also referred to as ambient), task and accent lighting.

The lighting plan package is usually employed in a lighting schema for the space. In some embodiments, the lighting schema includes a layout logic guide. The layout is the positioning of the different fixtures in a same space. For example, the layout may be a uniform layout, center layout, centerline layout, bounce layout, perimeter layout or a combination thereof.

The layout method is the guide to arrange the spatial location of the fixtures. In some embodiments, the layout method contains both a special arrangement and a social activity arrangement. The social activity layout in the ceiling can be based on the social activities that happen in the space below the lighting. This can be predicated by the furniture layout.

In one example, the layout logic guide also includes details regarding the mounting method, spatial spacing, beam distribution, aiming angle, control and dimming methods, color correlated temperature (CCT) of the lights in the layout, the color rendering index (CRI) of the lights, and the light colors.

In one embodiments, in which the space for the floorplan is an office, a common layout method is the uniform layout. Uniform layout equally spaces the number of lighting fixture throughout the floorplan space. One example of a uniform layout is depicted in FIG. 3, in which the lighting fixtures are identified by reference number 28

In another embodiment, in which the space for the floorplan is a meeting place having a sophisticated architectural design, the layout may include a uniformed arranged downlight width (in which the uniformly distributed fixtures are identified by reference number 28a) with linear lights along the perimeter (in which the perimeter lights are identified by reference number 28b), as depicted in FIG. 4.

In some embodiments, the schemas provided in the schema library include a fixture selection guide. For example, the fixture selection guide can arrange lighting so that tube lighting, e.g., 2×2 and/or 2×4 tube lighting office type fixtures, are present in the center of the room, while downlights are positioned around at least a portion of the lighting space. In another embodiment, fixture selection would include panel only lighting, e.g., only light emitting diode (LED) flat panel lighting, when the lighting space is greater than 50 meters squared (50 m$^2$).

In some embodiments, the schemas provided in the schema library can include a fixture installation guide. The fixture installation guide can provide instructions on how the different types of fixtures are to be installed in the space of the floor plan. For example, the fixture installation guide can include information to recess mount a fixture within a ceiling from a specific distance from the wall defining a perimeter of a floor plan. The fixture installation guide can also instruct to select a specific trim package for a recess light, such as a trim material and/or color, e.g., silver and/or black. The fixture installation guide may be provided to the user as part of the lighting report that is generated at block 9 of FIG. 1.

In some embodiments, the schemas provided in the schema library can include an illumination standard. The illumination standard may include the lux levels that the lights of the fixtures are set for. For example, the illumination standard may include a minimal lux level for the fixtures. In another example, the illumination standard may have a range of lux level from a minimum value to a maximum level.

In some embodiments, the schemas provided in the schema library can include a range of application. The range of application is the range at which a light can be projected by the fixtures. This measurement can be dependent upon the dimensions of the open space, e.g., the ceiling height. For example, in one embodiment, the range may be for a 3 meter to 5 meter height. This could be suitable for an open office floor plan with a rectangular like geometry. In another example, the range may be for a ceiling height that is practically unlimited. This could be suitable for a lighting space that provides a corridor.

As noted above, the database of historical lighting schema 21 include schema that can be pre-defined by professional lighting designers and can be expanded and extended. The lighting schemas can be saved in the database of historical lighting schemas 21 of the system 500. A lighting professional can add or remove lighting schemes through the interface 19 of the system. The lighting professional may communication through the interface 19 of the system 500 using a computing device, such as a mobile computing device, e.g., a laptop, tablet, smart phone or combination thereof. Additionally, the system 100 can include a that can update the database of historical lighting scheme 21.

Although the database of lighting schemes has been described above as including lighting packages and lighting layouts, the present disclosure is not limited to the selection and placement of lighting fixtures. For example, the database of lighting schemes may also include information directed to devices used to control the light fixtures, and their position for installation within the space of the floorplan. The control devices may be application specific control devices for controlling the lighting fixtures of the lighting package; the control devices may be SMART devices and/or the control devices may be internet of things (TOT) devices.

In some embodiments, the user may search the scheme library through an application that allows the user to view the lighting schemes on their mobile device so that they can select a lighting scheme matching the floorplan and assigned function for the space within the floorplan.

In other embodiments, the system 500 may automatically search the database of historical lighting schemes 21 to locate a lighting scheme that matches the layout of the floorplan and assigned functions entered by the user. Referring to FIG. 2, the system 500 may employ the lighting device layout (scheme) extractor 20 to match the layout of the floorplan and assigned functions entered by the user to a scheme. The lighting device layout schema extractor 20 extracts schemas from the database and applies the data from the schema to the characteristics of the layout and functions entered into the system 500 by the user. The lighting device layout (scheme) extractor 20 may include a series of rules that matches dimensions, geometries and the assigned functions for the space of the floorplan entered by the user into the system through the interface 19 to the floorplan of a lighting scheme and/or function from the database of historical lighting schemes 21. In some embodiments, the rules for extracting a lighting scheme from database of historical schemes can include a series of algorithms, or mathematical procedures, which work like a flow-chart or series of questions to compare the floorplan and assigned functions provided by the user with the stored reference floorplans and assigned functions for the lighting schemes in the database of historical lighting schemes 21. In some embodiments, the lighting device layout (scheme) extractor 20 may be aided by a form of artificial intelligence (A.I.). The type of A.I. employed can be rule-based.

The lighting device layout (scheme) extractor 20 may include at least one form of memory, e.g., hardware memory, for storing the rules for matching user floor plans and assignments to the floorplans and assignments of the schemes saved in the database of historical lighting schemes 21. The lighting device layout (scheme) extractor 20 may also include at least one processor, e.g., hardware processor, for performing functions in accordance with the rules in providing matches for extraction of the layout method from the lighting schemes from in database of historical lighting schemes 21.

As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

These and other variations of a hardware processor subsystem are also contemplated in accordance with embodiments of the present invention.

Referring to FIG. 1, in some embodiments, the method may continue to block 3. At block 3 of FIG. 1, the system 500 may extract the layout method from the scheme for the space that matched the floor plan and function provided by the user at block 1. More specifically, in some embodiments, once the floorplan and function for the lighting space has been matched to a lighting scheme from the database of historical lighting schemes 21, a lighting scheme is pulled from the database, in which the lighting scheme provides a lighting plan package of fixture types, a fixture schedule with fixture specifications, fixture layout plan and fixture installation guide.

Matching the lighting schemes from the database of historical lighting schemes 21 with the floorplan and assigned functions provided by the user may be provided by the lighting device layout (scheme) extractor 20. The lighting device layout (scheme) extractor 20 may include a series of rules that matches dimensions, geometries and the assigned functions for the space of the floorplan to the floorplan for a lighting scheme and/or function for a lighting scheme from the database of historical lighting schemes 21. In some embodiments, the rules for extracting a lighting scheme from database of historical can include a series of algorithms, or mathematical procedures, which work like a flow-chart or series of questions to compare the floorplan and assigned functions provided by the user with stored reference floorplans and assigned functions for the lighting schemes in the database of historical lighting schemes 21.

Referring to FIG. 1, once the layout is extracted from the historical lighting scheme matching the user entered floorplan and assigned functions, the method can continue to block 4 with a searching for fixtures that are available for the space and layout. As noted from above, the lighting schemes that are stored in the database of historical lighting schemes 21 includes a fixture selection guide for the space and assigned functions of the stored historical scheme. At block 4 that fixture selection guide is used to provide the fixture types that are suitable for the user floorplan and assigned function. Example of fixture types can include hanging pendants, desk lamps, table lamps, floor lamps, chandelier lamps, recessed can downlights, track lighting, and 2×2 and/or 2×4 tube lighting office type fixtures. Light emitting diode (LED) lighting elements can be employed in each of the aforementioned fixtures. The fixture types may also include both the physical geometries, dimensions, and appearance options, e.g., color, for the fixtures; and the lighting performance characteristics of the fixtures. The lighting characteristics performance may include lumens, color, color correlated temperature (CCT) and service life.

The lighting characteristic performance may also be characterized by their type of lighting, e.g., general (also referred to as ambient), task and accent lighting. The type of lighting can be dependent upon the assigned function by the user. This can be the case for task lighting. Task lighting can be directional light aimed at a specific task. Task lighting is a way to provide more light on a specific area to perform a task that requires more light than the ambient fixtures can provide. Task fixtures accomplish this without wasting energy trying to illuminate the entire space to the higher desired light level. Desk lamps, ceiling pendants, and appliance lights are all good examples of task fixtures. A desk lamp in an office or a ceiling pendant above a breakfast bar can give the additional light needed to read a newspaper or magazine. In some instances, two or more task lighting sources can be employed to minimize shadowing and reduce "hot spots" created by single light sources in task applications.

Referring to FIG. 2, to search for fixtures that are available for the space and layout at block 4, the system 500 may include a database of lighting fixtures 22 that includes all available lighting fixtures and devices that are available to the user. It is noted that the database of lighting fixtures 22 may also include data on the control devices that can be used to control the lighting functions of the lighting fixtures. The system 500 employs the lighting space modeling tool 23 to match the fixtures from the lighting scheme that was extracted by the lighting device layout (scheme) extractor 20 from the database of historical lighting schemes 21 to fixtures from the library of fixtures that are saved on the database of lighting fixtures 22. The database of lighting fixtures 22 may be stored in the system in a storage device, such as hardware memory, e.g., one or more modules of memory. One embodiment of a fixture library includes information directed to fixture type, fixture specifications, illumination parameters, dimensions parameters for the lighting fixtures (e.g., height, width, and aperture of the fixtures), fixture installation guide (e.g., to generate a final installation guide at block 9 of FIG. 1), and data directed to the applicable range of applications for a particular fixture. The applicable range could be a room type, such as an open office and/or meeting room. In some embodiments, the fixture library that is stored on the database of lighting fixtures includes illuminating engineering society (IES) files. An IES file is a photometric file that contains data, e.g., text data, on light for architectural programs that can simulate light.

The database of lighting fixtures 22 includes lighting fixtures that are available for purchase by the user. The database of lighting fixtures 22 can also provide the manufacturer and pricing of lighting fixtures for purchase by the user. In some further embodiments, the database of lighting fixtures 22 can provide locations for purchase, e.g., retail and/or distributor information, of the lighting fixtures.

Referring to FIG. 2, the lighting space modeling tool 23 can select lighting fixtures from the library of fixtures that are saved on the database of lighting fixtures 22 to meet the lighting characteristics of the fixture selection guide for the lighting scheme that was extracted by the lighting device layout (scheme) extractor 20 from the database of historical lighting schemas 21. In some embodiments, the light space modeling tool 23 can select the light fixtures based on the features of the space and fixtures available. The lighting space modeling tool 23 may include a series of rules that matches dimensions, geometries, lighting performance, installation guidance of the fixture selection guide for the lighting scheme that was extracted from the database of historical lighting schemas 21 to the database of lighting fixtures 22 that includes lighting fixtures that are available for purchase by the user. In some embodiments, the rules for matching fixtures from the database of lighting fixtures 22 to the lighting schema extracted from database of historical schemas can include a series of algorithms, or mathematical procedures, which work like a flow-chart or series of questions to compare the available lighting fixtures from the database 22 to potential matches in the fixture selection guide for the lighting schema that was extracted by the lighting device location extractor 20 from the database of historical lighting schemas 21. In some embodiments, the lighting space modeling tool 23 may be aided by a form of artificial intelligence (A.I.). The lighting space modeling tool 23 may include at least one form of memory, e.g., hardware memory, for storing the rules for matching available lighting fixtures from the database 22 to potential matches in the fixture selection guide for the lighting schema that was extracted from the database of historical lighting schemas 21. The lighting space modeling tool 23 may also include at least one processor, e.g., hardware processor, for actuating the instructions saved on the memory for matching available lighting fixtures from the database 22 to potential matches in the fixture selection guide for the lighting schema that was extracted from the database of historical lighting schemas 21.

It is noted that the matches between the lighting schema from the historical lighting schemas and the layout provided by the user at block 1 may not be identical matches. In some embodiments, the light space modeling tool 23 applies a light package extracted from the schema within the database to the layout and assigned functions provide by the user. The light space modeling tool 23 may do some adoption of the light packages to the specific layout and functions from the floorplan and assignments provided by the user. For example, the room sizes may be different sizes, and/or different geometries. In some examples, to compensate for differences between the layout used in the historical lighting schemas and the layout entered by the user into the interface 19 of the system, the lighting space modeling tool 23 may estimate the lighting impact of the difference, and modifying the lighting package to accommodate the difference in the layout of the new floorplan entered by the user into the interface 19.

Figure 5:
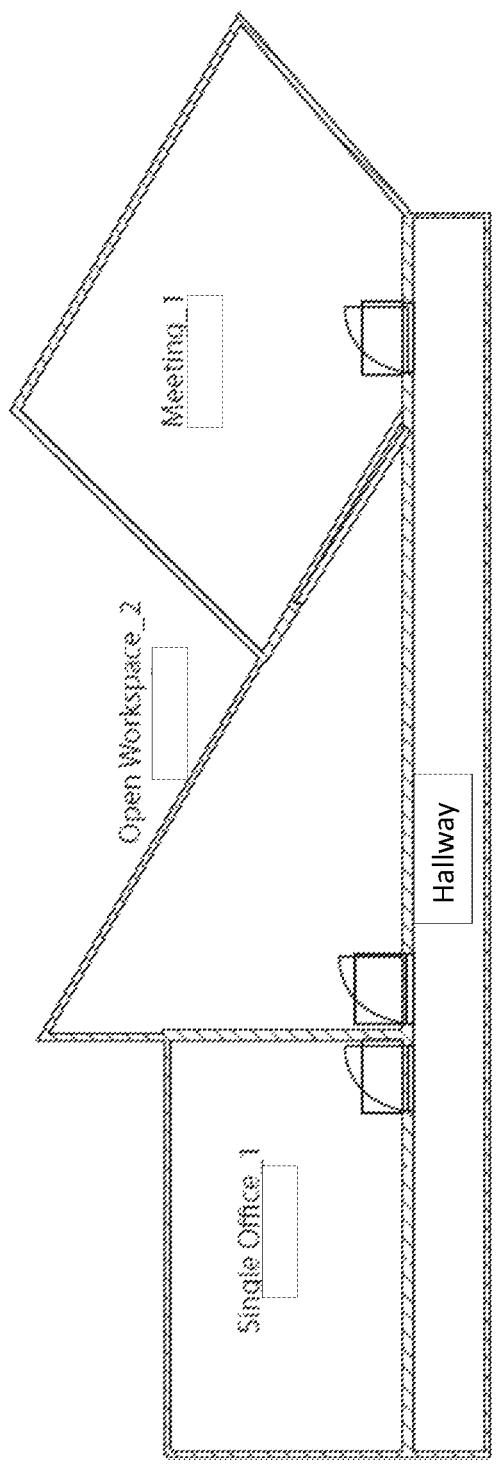
FIG. 5 is an illustration depicting one embodiment of an input space, in which the different rooms of the floor plan are identified as being a single office, an office workspace, and a meeting room, in accordance with one example of the present disclosure.

In some embodiments, the lighting space modeling tool 23 may employ the following steps, beginning with analyzing input spaces for the floorplan. This can include both spatial parameters and social parameters for the floorplan. By social parameters, it can be meant that the assigned function of the room, e.g., an office, kitchen, entertainment room etc. For example, FIG. 5 illustrates one embodiment of analyzing the input space, in which the different rooms, e.g., spaces, of the floor plan are identified as being a single office, an office workspace, a hallway and a meeting room.

Figure 6:
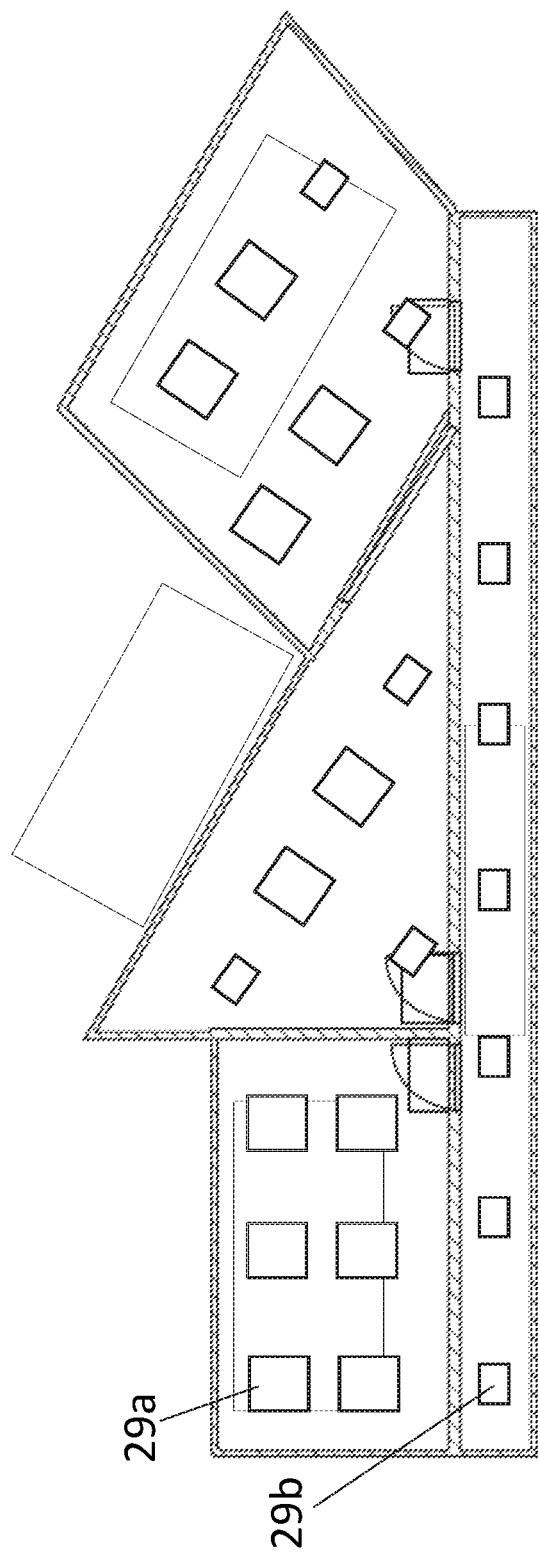
FIG. 6 is an illustration depicting a lighting layout and lighting package imported into the floorplan depicted in FIG. 5, in accordance with one embodiment of the present disclosure.

In a following step, the lighting space modeling tool 23 revised the one or more suitable schemas from the database of historical lighting schemas 21, depending on spatial and social features. The lighting space modeling tool 23 combines the layout guide from schemas, chooses fixtures by rules defined in the schemas and places the fixtures to the space with adjustments where appropriate. In FIG. 6, the layout includes a plurality of panel lights identified by 29a and recessed down lighting identified by reference number 29b. In one example, in the single office, the entirety of the room is filled with uniform panel lights. For example, in the office workspace there are two centrally positioned panel lights with recessed can lighting at the perimeter. The meeting room also includes a combination of recessed can lights and panel lights. The hallway includes recessed downlights.

For example, if the new space of the floorplan provided by the user is 20% larger than the floorplan of the matching lighting schema, the lighting space modeling tool 23 may increase the lighting output (increased illumination parameters from the fixture specification) of the lighting fixtures from the database of lighting fixtures 22, or the light space modeling tool 23 can increase the quantity of lighting fixtures in the layout of the lighting schema.

Referring to FIG. 1, the method may continue to block 5 with a simulated installation of the fixtures selected from the database of lighting fixtures 22 at block 4 using the layout extracted from the database of historical lighting schemas 21 by the lighting device layout (schema) extractor 20. The lighting space modeling tool 23 can calculate the number of lighting fixtures, and place the lighting fixtures in the right position of the lighting space based upon the extractive information from the schema within the database 21.

In some embodiments, the simulation may be provided by direct calculations, view dependent algorithms and/or scene dependent algorithms. Direct calculations can be used for lighting directly from light sources. These sources can be sun, daylight openings (total of sun and sky contribution), or luminaires. The term is used mainly in the text to link models involving luminaire design and calculation. They involve specific physical formulas and simplifications. They are often delineated in different national standard and cover most usual situations. One example of a direct calculation lighting simulation is the lumen method of simulation.

View dependent algorithm simulations, such as those including raytracing, are classified according to the direction from which rays are computed by the model in a scene. Rays are traced from the light source (forward tracing) or from observer's eyes (backward tracing) or both ways. This provides that the view dependent algorithm is an image bound method. It provides a way to compute light phenomena from direct illumination, specular surfaces and reflections. Refinements to the model were introduced through surface meshes. In this way, umbras and penumbras can be calculated.

In one example, the lighting simulation is provided by the Radiance suite of programs by Greg Ward of Lawrence Berkeley National Laboratory for the analysis and visualization of lighting in design. In the Radiance suite of programs, the input files specify the scene geometry, i.e., floorplan space, materials, luminaires, i.e., fixtures, time, date and sky conditions (for daylight calculations). Calculated values include spectral radiance (i.e., luminance+color), irradiance (illuminance+color) and glare indices.

Simulation results may be displayed as color images, numerical values and contour plots.

Referring to FIG. 2, in some embodiments, the lighting space modeling tool 23 may provide the simulation for placing the fixtures to the space based on the layout for the floorplan provided by the user at block 4 of the method depicted in FIG. 1. The memory of the lighting space modeling tool 23 and the hardware processor for the light space modeling tool 23 may be employed to generate the simulation for placing the fixtures on the layout method that is chosen by the method.

Figure 7:
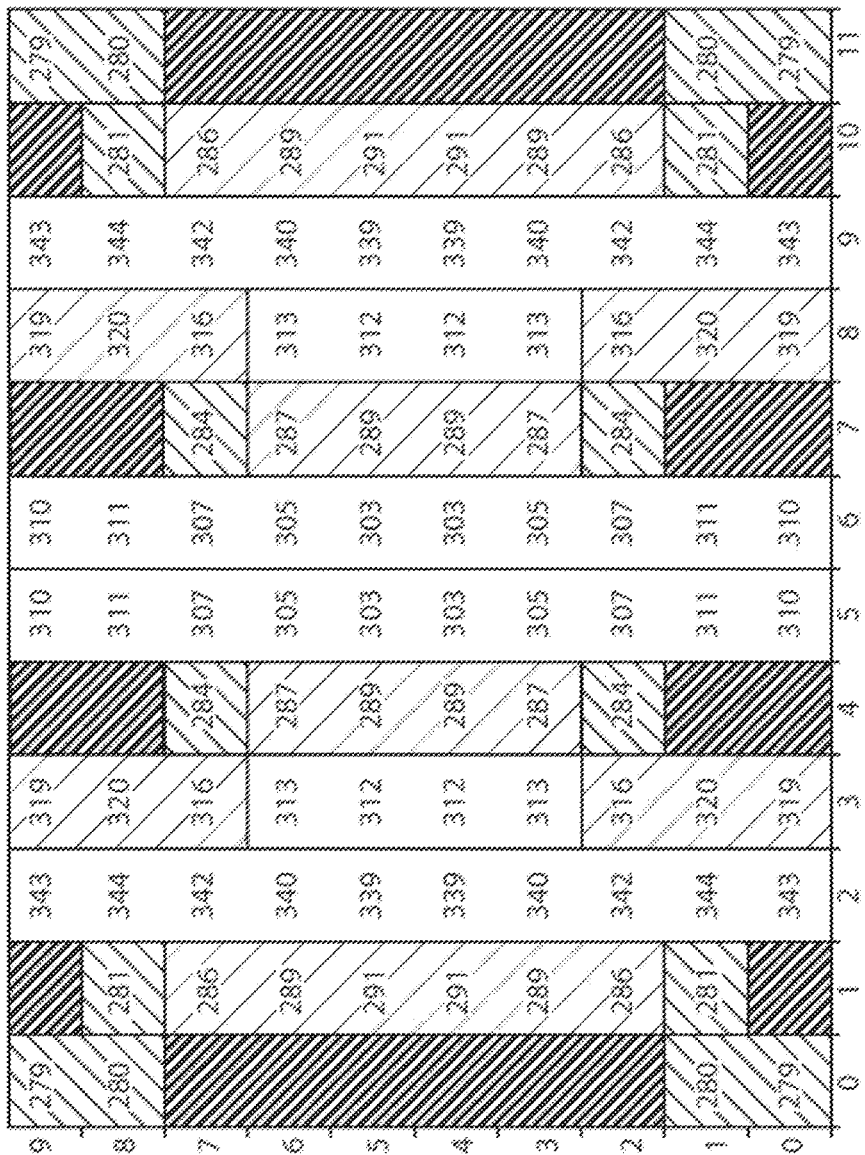
FIG. 7 is an illustration of a floorplan having a lighting layout of a simulated installed lighting package being sectioned into a grid for which the light characteristics of each module of the grid are being calculated, in accordance with one embodiment of the present disclosure.

Referring to FIG. 1, the method may include calculating illumination data at block 6. Using the simulation and estimate of illumination of the lighting package taken from the schema saved in the historical database 21, the system calculates the simulated illumination. In some embodiments, the photometric and illumination results are measured for each space. As depicted in FIG. 7, each space, e.g., room, of the floorplan may be sectioned into a grid, wherein the system can calculate photometric and illumination results for each module of the grid. The totality of the grid in then considered in determining whether the lighting schema, e.g., lighting fixtures and layout, meet an illumination standard at block 7.

Referring to FIG. 2, the calculation of illumination data at block 6 may be provided by a lighting performance calculator 24. The lighting performance calculator 24 includes memory for storing rules for calculating a light performance criteria, such as luminescence, e.g., lumens (lx). The lighting performance calculator 24 may also include at least one processor, e.g., hardware processor, for performing functions in accordance with the rules for calculating the light performance criteria.

Figure 8:
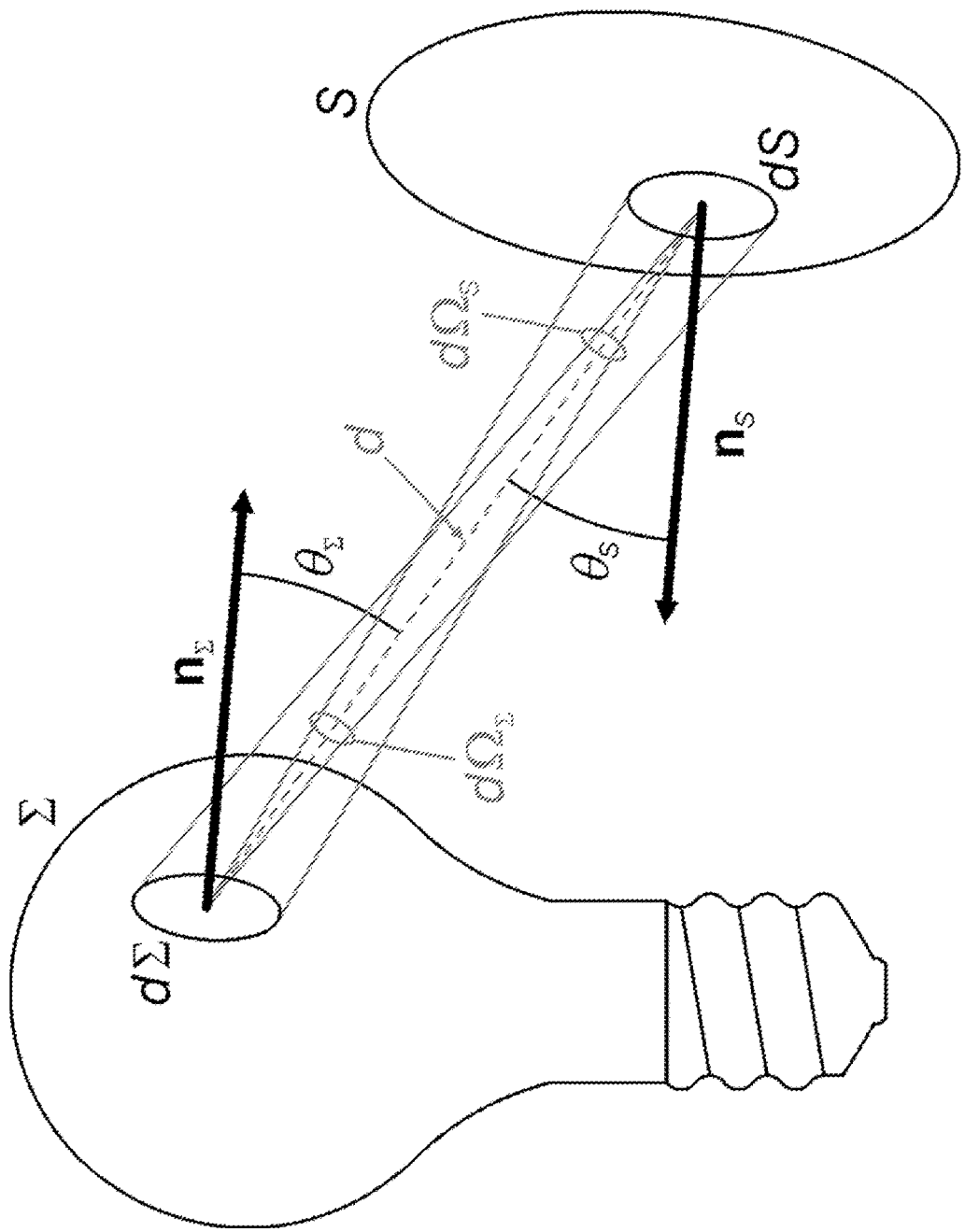
FIG. 8 is an illustration of light being projected by a light source for the purposes of illustrating a calculation for luminance.

In one embodiment, the lighting performance calculator 24 can measure luminance of the space being evaluated. Luminance is a photometric measure of the luminous intensity per unit area of light travelling in a given direction. It describes the amount of light that passes through, is emitted from, or is from a particular area, and falls within a given solid angle. Referring to FIG. 8, the luminance of a specified point of a light source, in a specified direction, is defined by the derivative, as follows:

$$L_v = \frac{d^2\Phi_v}{d\Sigma \, d\Omega_\Sigma \cos\theta_\Sigma}$$

Where:
$L_v$ is the luminance (cd/m$^2$),
$d^2\Phi_v$ is the luminous flux (lm) leaving the area $d\Sigma$ in any direction contained inside the solid angle $d\Omega_\Sigma$,
$d\Sigma$ is an infinitesimal area (m$^2$) of the source containing the specified point,
$d\Omega_\Sigma$ is an infinitesimal solid angle (sr) containing the specified direction,
$\theta_\Sigma$ is the angle between the normal $n_\Sigma$ to the surface $d\Sigma$ and the specified direction.

It is noted that luminance is only one example of a lighting characteristic that may be measured by the lighting performance calculator. It is not intended that the lighting performance calculator 24 be interpreted as only measuring luminance. For example, the lighting performance calculator 24 may measure other lighting characteristics, such as color correlated temperature (CCT).

Referring to FIG. 1, the measured lighting characteristics are then compared with an illumination standard at block 7 to determine whether the lighting layout and package meets the requirements of the lighting standard. Referring to FIG. 2, the system 500 may include a lighting standard database 26, which can include at least one form of memory, e.g., hardware memory, for storing lighting standards. The lighting standard database 26 provides the standard that the lighting performance calculator 24 compares the measured lighting performance to in determining the adequacy of the lighting layout and lighting package. The totality of the grid depicted in FIG. 7 can be considered in determining whether the lighting schema, e.g., lighting fixtures and layout, meet an illumination standard at block 7.

In one embodiment, the regulation that is stored in the lighting standard database 26 is SFS-EN 12461-1:2011. The SFS-EN 12461-1:2011 standard specifies the minimum required illuminance levels for the task area and its surroundings, as illustrated in the following Table 1.

TABLE 1

| Luminance ratios for a task area and its immediate vicinity | |
|---|---|
| Illuminance in the task area $E_{task}$ (lx) | Illuminance in the immediate vicinity of the task area (lx) |
| ≥750 | 500 |
| 500 | 300 |
| 300 | 200 |
| 200 | 150 |
| 150 | $E_{task}$ |
| 100 | $E_{task}$ |
| ≤50 | $E_{task}$ |

In one example, the minimum illuminance is 50 lx for walls and 30 lx for ceilings. Illuminance in the surrounding areas must be no less than a third of the illuminance in the immediate vicinity of the task area. This improves the luminance ratio in the space, increasing visual comfort and performance. The illuminance uniformity value must be no less than 0.4 in the immediate vicinity and no less than 0.1 in the background. Examples of lighting requirements for spaces, areas, tasks, and activities are presented in Table 2.

TABLE 2

| Examples of lighting requirements for spaces, areas, tasks, and activities | | | | | |
|---|---|---|---|---|---|
| Space | Illuminance (lx) | UGR index | Uniformity $U_0(E_{min}/E_m)$ | $R_a$ index | Notes |
| Areas with traffic and corridors | 100 | 28 | 0.4 | 40 | 150 lx off ground level if there are vehicles on the route |
| Stairways, escalators, and travelators | 100 | 25 | 0.4 | 40 | |
| Lifts | 100 | 25 | 0.4 | 40 | In front of a lift, no less than 200 lx |
| Loading bays | 150 | 25 | 0.4 | 40 | |
| Coffee-break rooms | 200 | 22 | 0.4 | 80 | |
| Technical facilities | 200 | 25 | 0.4 | 60 | |
| Storage spaces | 100 | 25 | 0.4 | 60 | 200 lx if work is |

TABLE 2-continued

Examples of lighting requirements for spaces, areas, tasks, and activities

| Space | Illuminance (lx) | UGR index | Uniformity $U_0(E_{min}/E_m)$ | $R_a$ index | Notes |
|---|---|---|---|---|---|
| Electronics workshops, testing, and adjustments | 1500 | 16 | 0.7 | 80 | continuous |
| Ball-mill areas and pulp plants | 200 | 25 | 0.4 | 80 | |
| Offices and writing | 500 | 19 | 0.6 | 80 | |
| Check-out areas | 500 | 19 | 0.6 | 80 | |
| Waiting rooms | 200 | 22 | 0.4 | 80 | |
| Kitchens | 500 | 22 | 0.6 | 80 | A restaurant's kitchen and dining area should be separated by an adjustment zone |
| Parking areas | 75 | — | 0.4 | 40 | Illuminance from floor level |
| Classrooms | 300 | 19 | 0.6 | 80 | Lighting should be adjustable |
| Auditoriums | 500 | 19 | 0.6 | 80 | Lighting should be adjustable to different audiovisual situations |

In some embodiments, for indoor activity areas, the mean cylindrical illuminance must be at least 50 lx and the uniformity no less than 0.1, as calculated 1.2 m above floor level. For spaces where visual communication is especially important, such as offices and education premises, the maintained mean cylindrical illuminance should not be less than 150 lx, with uniformity no less than 0.1.

It is noted that the above examples are provided for illustrative purposes only, and are not intended to limit the present disclosure. Any number of standards may be applicable to evaluate lighting, and can be used in the methods consistent with blocks 6 and 7 of FIG. 1.

Referring to FIGS. 1 and 2, the step of comparing the calculated lighting characteristics at block 6 to the illumination standard that is saved in the lighting standard database 26 at block 7 may be performed by the lighting performance calculator 24. The lighting performance calculator 24 may include a series of rules saved in a form of memory, e.g., hardware memory, that provides for acceptable degrees of conformance between the calculated lighting characteristics and the illumination standard. In some embodiments, the rules for rating whether a calculated lighting performance of a lighting schema matches the lighting standard from the lighting standard database 26 can include a series of algorithms, or mathematical procedures, which work like a flow-chart or series of questions to compare the calculated lighting to the corresponding values for the standard.

Referring to FIG. 1, in some embodiments, if the lighting layout and lighting package meets the standards for lighting at block 7, the method may continue to block 9, which includes generating an illumination plan. In some embodiments, if the lighting layout and lighting package does not meet the standards for lighting at block 7, the method may continue to block 8. Block 8 includes adjusting the layout and lighting fixture package using the calculated lighting and the deficiency from the standard as the base for a corrective modification.

Referring to FIG. 2, the system 500 may include a light adjustment calculator 27 for modifying the lighting fixture package, as well as the layout, in order to change the lighting schema to overcome the deficiency measured at block 7, and meet the lighting standard that is stored in the lighting standard database 26.

For example, at block 8 of the method, the light adjustment calculator 27 may increase the overall number of fixtures in the layout if it is determined at block 7 that the total illuminance is low. For example, at block 8 of the method, if it is determined at block 7 that the illuminance is low for a particular area, the light adjustment calculator 27 may increase the number of fixtures in the deficient area of the layout. In yet another example, when the standard includes measurements for the homogenization of light, the light adjustment calculator 27 may do a fixture homogenization adjustment.

These are only some examples of how the light adjustment calculator 27 can modify the previously providing lighting layout and lighting package to provide a calculated lighting that matches, e.g., exceeds, the lighting standard. The lighting adjustment calculator 27 can also provide different layouts, e.g., by selecting a new layout from the database of historical lighting schemas 21. The lighting adjustment calculator 27 can also combine two layouts selected from the database of historical lighting schemas 21. The lighting adjustment calculator 27 can also revise the types of light fixtures being employed in a lighting package.

The lighting adjustment calculator 27 may include a series of rules saved in a form of memory, e.g., hardware memory, that provides for light adjustments to meet the illumination standard. In some embodiments, the rules for modifying the lighting schema to match the lighting standard from the lighting standard database 26 can include a series of algorithms, or mathematical procedures, which work like a flow-chart or series of questions to compare the calculated lighting to the corresponding values for the standard.

Referring to FIG. 1, in the examples, in which the lighting schema and/or lighting package is modified by the lighting adjustment calculator 27 at block 8, the modified lighting schema and/or lighting package is then tested. More specifically, the modified lighting schema and/or lighting package is tested by calculating the illumination data of the modified lighting schema and/or lighting package at block 6, and determining with the illumination standard is met at block 7. The above descriptions of blocks 6 and 7 are applicable at this stage of the process flow. If at this point, the modified lighting schema and/or lighting package meets the standard from the lighting standard database 26, the method may continue to block 9. Block 9 includes generating an illumination plan.

In some embodiments, if the modified lighting layout and lighting package does not meet the standards for lighting at block 7, the method may continue to again to block 8. Block 8 includes adjusting the layout and lighting fixture package using the calculated lighting, and the deficiency from the standard as the base for a corrective modification. This sequence of modifying the lighting layout and/or lighting package, calculating the illumination data, and determining whether the modified lighting layout and/or lighting package meets the standard in the lighting standard database 26 can continue until an acceptable layout and/or lighting package meets the standard from the lighting standard database 26.

Referring to FIG. 1, when the calculating lighting matches the lighting standard meets the standard from the lighting standard database 26, the method may continue to block 9. Block 9 includes generating an illumination plan. Referring to FIG. 2, generating an illumination plan may be provided by a lighting plan generator 25 in the system for automatic illumination planning 500. The lighting plan generator 25 can combine the fixture layout plan provided by blocks 3, 5 and 8, fixture installation guide providing by blocks 3, 4 and 8, and illumination results that were calculated at block 6 as a lighting plan, and export to the results to the user. This can be in the form of a report displayed on a user interface, e.g., monitor screen, of the computing device through which the user is interacting with the system for automatic illumination planning 500. In other embodiments, the report can be automatically reduced to a print form.

Figure 9:
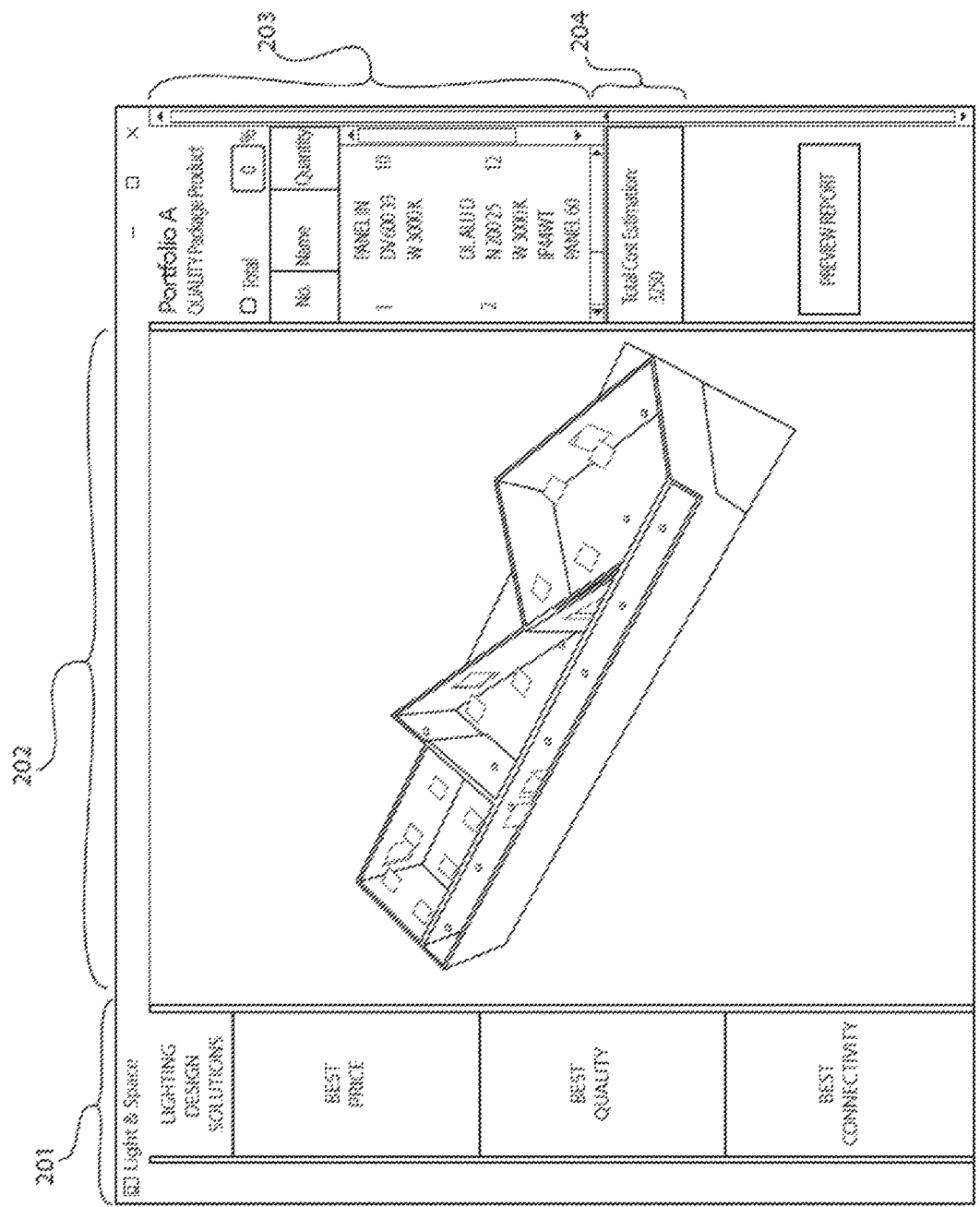
FIG. 9 illustrates one embodiment of a report generated for the lighting layout and light package by the methods, systems and computer program products of the present disclosure.

FIG. 9 is an illustration of a report generated for the lighting layout and light package being generated by the methods, systems and computer program products of the present disclosure.

FIG. 9 illustrates a report including three options 201 for lighting packages and layouts, e.g., a best price option, best quality option, and best connectivity option. The report may also include a depiction 202 of a layout and lighting package installation for the floorplan that was provided by the user at block 1 of the method depicted in FIG. 1. For example, the depiction 202 of the layout and lighting package installation may be in a three dimensional space, which matches the floorplan provided by the users at block 1 of the method illustrated in FIG. 1. The depiction may include lighting calculations illustrating the lighting performance. The depiction may also provide a simulation of light being projected by the light fixtures matching the calculated lighting performance. The report may also include a product list 203, e.g., list of all the light fixture types and their quantity, as well as a list of control devices. In some embodiment, the report may also include an estimate for cost 204 for the products within the product list 203. The report may be displayed on a monitor for the mobile device through which the user is interfacing with the system for providing illumination plans 500. The report may also have a command for generating a physical copy, e.g., print copy, for the user.

In some embodiments, the methods, systems and computer program products of the present disclosure can provide that a general lighting plan without to the need to have knowledge of professional lighting designing to get a qualified lighting plan. The lighting plan provided by the methods, systems and computer program products also factors into the layout and light fixture page the social divisions and uses for the space being considered. Not only fixture layout is provided, but also a fixture installation guide is produced, which means customers can use the final output as an instruction for installing and building the lighting system. More complicated and sophisticated layout/arrangement are also available, which means the system, method and computer program products do not just provide uniformed layout support for specified lamp only-compares to existing quick design tools. Schemas can be expanded and extended.

Exemplary applications/uses to which the present invention can be applied include, but are not limited to the installation of lighting layouts and lighting packages to custom spaces.

Figure 10:
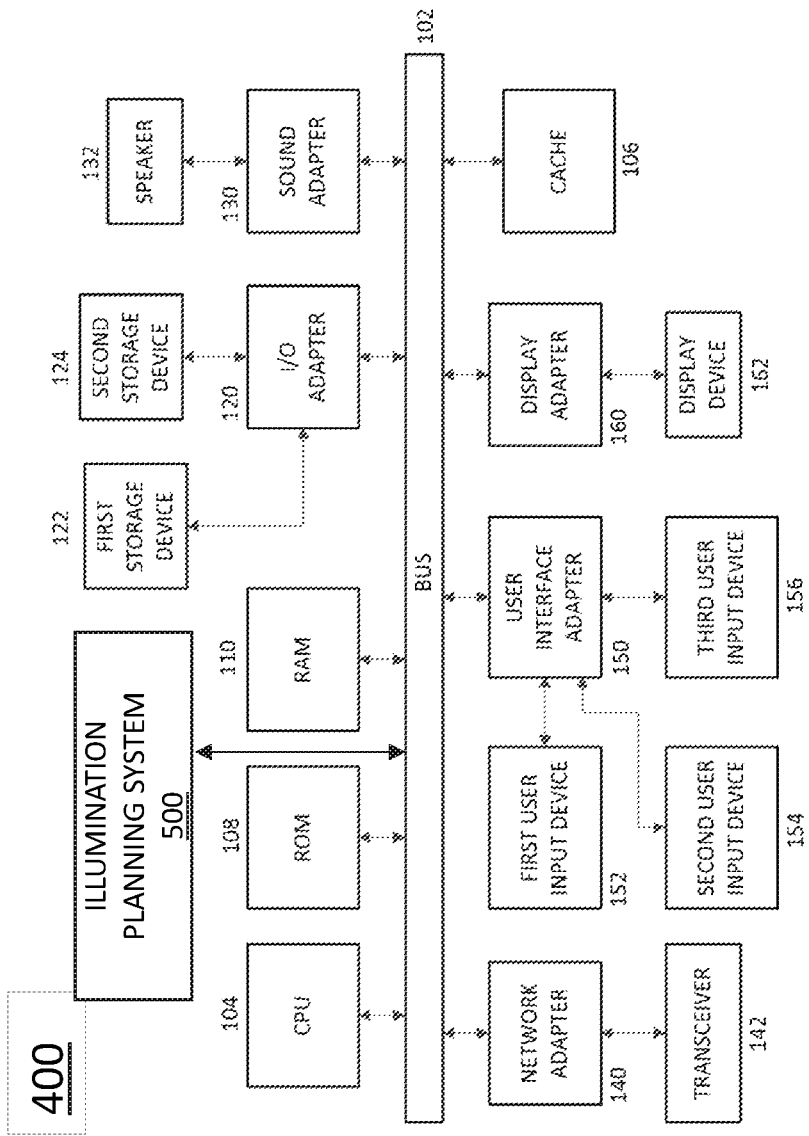
FIG. 10 is a block diagram illustrating a processing system that can incorporate the system for providing an illumination planning system in FIG. 2, in accordance with one embodiment of the present disclosure.

Additionally, the system 500 that is depicted in FIG. 2 may be integrated into the processing system 400 depicted in FIG. 10. The processing system 400 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102. The bus 102 interconnects a plurality of components has will be described herein.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 100.

Of course, the processing system 400 may also include other elements (not shown), as readily contemplated by one of skill in the art, as well as omit certain elements. For example, various other input devices and/or output devices can be included in processing system 400, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 400 are readily contemplated by one of ordinary skill in the art given the teachings of the present invention provided herein.

The present invention may be a system, a method, and/or a computer program product at any possible technical detail level of integration. The computer program product may include a computer readable storage medium (or media) having computer readable program instructions thereon for causing a processor to carry out aspects of the present invention.

For example, the present disclosure provides a computer program product that includes a non-transitory computer readable storage medium having computer readable program code embodied therein for a method of providing an illumination plan. The method actuated by the computer program product may include receiving a floorplan having at least one lighting space; and assigning, using the processor, functions to the lighting space. The method can further match, using the processor, the lighting space and functions assigned to the lighting space to a historical lighting schema; and extract a lighting layout, using the processor, from the historical lighting schema that is matched to the lighting space. The method may also extract a light package, using the processor, from the historical lighting schema that is matched to the lighting space. In a following step, the method calculates lighting performance, using the processor, for the lighting layout and the light package that has been matched to the lighting space to determine whether the lighting performance meets a lighting standard or whether the lighting performance does not meet the lighting standard. The method can continue to generate a conclusion, using the processor, for the lighting scenario for suitability to the floorplan and functions. The conclusion can include a report for installation of the lighting layout and the light package when the lighting performance meets the lighting standard. In the event that the lighting layout and lighting package does not meet the lighting standard, the conclusion may also include a recalculation of lighting performance of at least one of a modified lighting layout and a modified light package to meet the lighting standard.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

Having described preferred embodiments of a system and method for illumination planning (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A computer implemented method for illumination planning comprising:
  providing a floorplan having at least one lighting space;
  assigning functions to the at least one lighting space;
  matching the lighting space and functions assigned to the at least one lighting space to a historical lighting scheme;
  extracting a lighting layout from the historical lighting scheme that is matched to the at least one lighting space;
  extracting a light package from the historical lighting scheme that is matched to the at least one lighting space;
  calculating lighting performance for the lighting layout and the light package that has been matched to the at least one lighting space to determine whether the lighting performance meets a lighting standard or whether the lighting performance does not meet the lighting standard, wherein the calculating lighting performance comprises luminance:

$$L_v = \frac{d^2\Phi_v}{d\sum d\Omega_\Sigma \cos\theta_\Sigma}$$

where:
  $L_v$ is the luminance (cd/m$^2$),
  $d^2\Phi_v$ is the luminous flux (lm) leaving the area $d\Sigma$ in any direction contained inside the solid angle $d\Omega_\Sigma$,
  $d\Sigma$ is an infinitesimal area (m$^2$) of the source containing the specified point,
  $d\Omega_\Sigma$ is an infinitesimal solid angle (sr) containing the specified direction, and
  $\theta_\Sigma$ is the angle between the normal $n_\Sigma$ to the surface $d\Sigma$ and the specified direction;
  generating a conclusion for the lighting scenario for suitability to the floorplan and functions, the conclusion including a report for installation of the lighting layout and the light package when the lighting performance meets the lighting standard or the conclusion including a recalculation of lighting performance of at least one of a modified lighting layout and a modified light package to meet the lighting standard; and
  installing the lighting layout and the light package.

2. The method of claim 1, wherein the lighting package includes fixtures having a light source provided by at least one light emitting diode (LED).

3. The method of claim 1, wherein the lighting performance is a measurement of illuminance.

4. The method of claim 3, wherein when the calculating lighting performance for the lighting layout and the light package that has been matched to the at least one lighting space determines that the illuminance for the lighting performance is less than a requirement for the illuminance for the standard, the recalculation of the lighting performance comprises increasing an overall number of fixtures in the lighting layout for an entirety of the floorplan.

5. The method of claim 3, wherein when the calculating lighting performance for the lighting layout and the light package that has been matched to the at least one lighting space determines that the illuminance for the lighting performance of a singular space in the floorplan is less than a requirement for the illuminance for the standard, the recalculation of the lighting performance comprises increasing a number of fixtures in a deficient area singular space of the floorplan.

6. The method of claim 1, wherein the report for installation of the lighting layout and the light package includes installation instructions for light fixtures of the lighting package.

7. The method of claim 1, wherein the lighting plan package includes light fixtures selected from the group consisting of hanging pendants, desk lamps, table lamps, floor lamps, chandelier lamps, recessed can downlights, track lighting, 2x2 tube lighting office type fixtures, 2x4 tube lighting office type fixtures and combinations thereof.

8. The method of claim 1, wherein the lighting layout is a light location distribution type selected from the group consisting of a uniform layout, a centerline layout, a perimeter layout and a combination thereof.

9. A system for planning light illumination comprising:
  an interface for receiving at least one of a floorplan having at least one lighting space, and assigned functions for the at least one lighting space;
  memory for at least a database historical lighting schemes and a database of lighting fixtures;
  a lighting device layout extractor for extracting a lighting layout from the historical lighting scheme matched to the lighting space;
  a lighting space modeling tool for extracting a light package from the historical lighting scheme, and providing a lighting simulation for the lighting layout and the lighting package;
  a lighting performance calculator for calculating lighting performance for the lighting layout and the light package to determine whether the lighting performance meets a lighting standard or whether the lighting performance does not meet the lighting standard, wherein the calculating lighting performance comprises luminance:

$$L_v = \frac{d^2\Phi_v}{d\sum d\Omega_\Sigma \cos\theta_\Sigma}$$

where:
  $d^2\Phi_v$ is the luminous flux (lm) leaving the area $d\Sigma$ in any direction contained inside the solid angle $d\Omega_\Sigma$,
  $d\Sigma$ is an infinitesimal area (m$^2$) of the source containing the specified point,
  $d\Omega_\Sigma$ is an infinitesimal solid angle (sr) containing the specified direction, and
  $\theta_\Sigma$ is the angle between the normal $n_\Sigma$ to the surface $d\Sigma$ and the specified direction;
  a lighting adjustment calculator for when the lighting performance does not meet the lighting standard, wherein the lighting adjustment calculator modifies at least one of the lighting layout and the light package to provide at least one of a modified layout and modified package to meet the lighting standard;
  a report generator for generating a reporting of lighting data selected from the group consisting of the lighting layout, the modified layout, the lighting package, the modified package and combinations thereof; and
  installing the lighting layout and the light package.

10. The system of claim 9, wherein the lighting package includes fixtures having a light source provided by at least one light emitting diode (LED).

11. The system of claim 9, wherein the lighting performance is a measurement of illuminance.

12. The system of claim 11, wherein when the calculating lighting performance for the lighting layout and the light package that has been matched to the at least one lighting space determines that the illuminance for the lighting performance is less than a requirement for the illuminance for the standard, the recalculation of the lighting performance comprises increasing an overall number of fixtures in the lighting layout for an entirety of the floorplan.

13. The system of claim 11, wherein when the calculating lighting performance for the lighting layout and the light package that has been matched to the at least one lighting space determines that the illuminance for the lighting performance of a singular space in the floorplan is less than a requirement for the illuminance for the standard, the recalculation of the lighting performance comprises increasing a number of fixtures in a deficient area singular space of the floorplan.

14. The system of claim 9, wherein the report for installation of the lighting layout and the light package includes installation instructions for light fixtures of the lighting package.

15. The system of claim 9, wherein the lighting plan package includes light fixtures selected from the group consisting of hanging pendants, desk lamps, table lamps, floor lamps, chandelier lamps, recessed can downlights, track lighting, 2x2 tube lighting office type fixtures, 2x4 tube lighting office type fixtures and combinations thereof.

16. The system of claim 9, wherein the lighting layout is a light location distribution type selected from the group consisting of a uniform layout, a centerline layout, a perimeter layout and a combination thereof.

17. A computer program product for planning illumination, the computer program product comprising a computer readable storage medium having program instructions embodied therewith, the program instructions executable by a processor to cause the processor to:
receive a floorplan having at least one lighting space;
assign, using the processor, functions to the lighting space;
match, using the processor, the lighting space and functions assigned to the lighting space to a historical lighting scheme;
extract a lighting layout, using the processor, from the historical lighting scheme that is matched to the lighting space;
extract a light package, using the processor, from the historical lighting scheme that is matched to the lighting space;
calculating lighting performance, using the processor, for the lighting layout and the light package that has been matched to the lighting space to determine whether the lighting performance meets a lighting standard or whether the lighting performance does not meet the lighting standard, wherein the calculating lighting performance comprises luminance:

$$L_v = \frac{d^2\Phi_v}{d\sum d\Omega_\Sigma \cos\theta_\Sigma}$$

where:
$L_v$ is the luminance (cd/m$^2$),
$d^2\Phi_v$ is the luminous flux (lm) leaving the area d$\Sigma$ in any direction contained inside the solid angle d$\Omega_\Sigma$,
d$\Sigma$ is an infinitesimal area (m$^2$) of the source containing the specified point,
d$\Omega_\Sigma$ is an infinitesimal solid angle (sr) containing the specified direction, and
$\theta_\Sigma$ is the angle between the normal n$_\Sigma$ to the surface d$\Sigma$ and the specified direction;
generate a conclusion, using the processor, for the lighting scenario for suitability to the floorplan and functions, the conclusion including a report for installation of the lighting layout and the light package when the lighting performance meets the lighting standard or the conclusion including a recalculation of lighting performance of at least one of a modified lighting layout and a modified light package to meet the lighting standard; and
installing the lighting layout and the light package.

18. The computer program product of claim 17, wherein the lighting package includes fixtures having a light source provided by at least one light emitting diode (LED).

19. The computer program product of claim 17, wherein the lighting performance is a measurement of illuminance.

20. The computer program product of claim 17, wherein the report for installation of the lighting layout and the light package includes installation instructions for light fixtures of the lighting package.

* * * * *